United States Patent [19]

Ballatore et al.

[11] 4,263,518

[45] Apr. 21, 1981

[54] ARRANGEMENT FOR CORRECTING THE VOLTAGE COEFFICIENT OF RESISTANCE OF RESISTORS INTEGRAL WITH A SEMICONDUCTOR BODY

[75] Inventors: Daniel Ballatore, Le Bar/Loup; Francois Delaporte, Cagnes-sur-Mer; Gerard Lebesnerais, Saint Fargeau-Ponthierry; Jean-Paul Nuez, Mennecy, all of France

[73] Assignee: International Business Machines Corporation, Armonk, N.Y.

[21] Appl. No.: 46,529

[22] Filed: Jun. 7, 1979

[30] Foreign Application Priority Data

Jun. 29, 1978 [FR] France .................. 78 20115

[51] Int. Cl.³ ............... H01L 27/10; H01L 29/76
[52] U.S. Cl. .................... 307/303; 148/1.5;
357/22; 357/48; 357/51; 357/53
[58] Field of Search .............. 357/51, 53, 23, 41,
357/48, 22, 84, 91; 307/303

[56] References Cited

U.S. PATENT DOCUMENTS

| 4,161,742 | 7/1979 | Kane ..................... 357/48 |
| 4,164,668 | 8/1979 | Delaporte et al. ........ 307/303 |

FOREIGN PATENT DOCUMENTS 1566559  5/1969  France .
7901662  of 0000  France .
51-140581  12/1976  Japan .

OTHER PUBLICATIONS

Lin, Integrated Electronics, Holden-Day Pub. Co., San Francisco, 1967, pp. 16-19, 194-199.

Primary Examiner—William D. Larkins
Attorney, Agent, or Firm—John A. Jordan

[57] ABSTRACT

Arrangements are described for correcting the voltage coefficient of resistance (VCR) of resistors integral with a semiconductor body and, more particularly, for correcting the VCR of resistors implanted in a semi-conductor body. Resistors typically comprising a resistive region of a first conductivity type formed in an isolated layer of opposite conductivity type which isolated layer, in general, includes an epitaxial layer passivated by a dielectric layer. A metal layer is formed on the dielectric layer and covers, at least partially, the resistive layer. The metal layer is brought to a suitable potential to produce opposite variations in the resistance with respect to variations created by the epitaxial layer.

7 Claims, 10 Drawing Figures

ARRANGEMENT FOR CORRECTING THE VOLTAGE COEFFICIENT OF RESISTANCE OF RESISTORS INTEGRAL WITH A SEMICONDUCTOR BODY

BACKGROUND OF THE INVENTION

1. Field of the Invention

The present invention relates to the field of resistors integral with a semiconductor body, formed, for example, by diffusion or ion implantation into a single-crystal semiconductor substrate, typically of silicon. More particularly, the present invention relates to a method of correcting the voltage coefficient of resistance (VCR) in implanted resistors and the resistor structures resulting therefrom.

In the field of semiconductor electronics, circuit designers are relying more and more on the use of integrated circuit structures. These structures have developed at a rapid pace in recent years as a result of the many improvements made in basic active and/or passive components. Besides the active components such as transistors, diodes, etc., passive components, especially resistors, continue to play an essential role in many applications such as, for example, applications involving analog circuits. Two technologies can be used to associate resistors with active components in integrated circuits: one of these is the compatible hybrid technology wherein resistors are deposited in the form of thin films on the surface of an integrated semiconductor chip; the other is the monolithic technology in which the resistors are formed within the semiconductor chip itself in the same manner as the active components. In the latter case, the resistors can be formed either by thermal diffusion or by ion implantation.

Diffused resistors are well known in the art. These resistors are generally formed during the diffusion step of the base or emitter region of bipolar transistors. Conventionally, a P type base region is diffused into a N⁻ type epitaxial layer which overlays a P⁻ type single-crystal silicon substrate. The value of the resistor depends upon a number of parameters such as the profile and depth of the diffusions, the length-to-width ratio of the diffused zone, etc. Two ohmic contacts are formed at the ends of the diffused region and constitute the output terminals of the resistor. The most positive potential of the circuit is generally applied to that portion of the epitaxial layer which is located within the isolation pocket, which includes the resistive region. The limitations of such resistors are their low sheet resistance (400 $\Omega/\square$), the low accuracy of their nominal value ($\pm 20\%$) and their high temperature coefficient (of the order of 2000 ppm/°C.), resulting in a significant variation of the resistance as a function of the temperature: 10% between 25° and 75° C. On the other hand, the method of forming such resistors is well known and relatively simple to use.

Implanted resistors are a particularly interesting alternative to diffused resistors and offer significant advantages over the latter. In particular, boron implanted resistors exhibiting a wide range of sheet resistance values (3 to 10,000 $\Omega/\square$ and over) and a low sensitivity to temperature (resistance variation of 0.5% between 0° and 75° C.) can be obtained. In addition, such resistors are relatively accurate and generally well matched ($\pm 2\%$). This type of device is discussed in an article by K. Rosendal entitled "Ion Implanted Planar Resistors", in Radiation Effects, Vol. 7, pp. 95-100, Nos. 1 & 2, January 1971.

A comparative study of the three types of resistors mentioned above may be found in an article by J. Den Boer et al entitled "The Thermal Properties of High Value Gallium and Boron Implanted Resistors in Silicon", appearing in European Conference on Ion Implantation, Sept. 7-9, 1970.

2. Description of Problem and Prior Art

A problem to which little attention has been paid until recently, namely, the variation of the resistance value as a function of the voltage applied across the resistor, appears to be of growing importance. The I-V characteristic of a resistor should normally be linear. It has been found that this only holds true with respect to implanted resistors exhibiting a low sheet resistance of the order of a few hundred ohms/$\square$. This has been shown in an article by John McDougall et al entitled "High Value Implanted Resistors for Microcircuits" appearing in Proceedings of the IEEE, Vol. 57, No. 9, page 1540, September 1969, and, more particularly, as shown in FIG. 5 of this article.

If high value implanted resistors that require high sheet resistance values (e.g. 20 K$\Omega/\square$) are desired, the I-V characteristic becomes nonlinear and slopes downwards, causing the response of the resistor to an input signal to be distorted. This demonstrates that the actual value of the resistor at a given voltage is higher than the value measured with a very low voltage. The I-V characterstic is then in every way similar to that of a junction field effect transistor (JFET). It should be clearly understood that the value of the resistor is primarily a function of the voltage applied to the junction between the resistive region and the epitaxial layer. This value is to some extent related to the voltage $V_R$ across the resistor. The distortion is due to the fact that the depletion layer, located on both sides of the PN junction and devoid of charge carriers, tends to become wider as the voltage applied to the PN junction increases, thereby reducing the effective cross-section of the resistor and ultimately increasing its value. This is the well-known problem of pinch-off voltage which is associated, in particular, with JFETs, but is more critical with respect to implanted resistors than with respect to diffused resistors since implanted resistors generally exhibit higher resistivities and are consequently thinner and less doped.

A first solution to the pinch-off voltage problem is described in an article by John McDougall, supra, and involves increasing the resistivity of the epitaxial layer to achieve values higher than 100 ohms-cm. However, this can adversely affect some electrical parameters of adjacent active devices.

Another solution would be to limit the development of the depletion layer within the resistive region so as to decrease, as we have seen, the nominal value of the resistor. This can be achieved by increasing the ion dose, as described in an article by J. W. Hanson entitled "Ion Implanted N Type Resistors on High Resistivity Substrates", in J. Vac. Sci. Tech., Vol. 10, No. 6, November-December 1973, and more particularly as illustrated in FIG. 6 of that article.

Still another solution is proposed in French patent No. 71 44227 assigned to Philips. Although no specific reference to the VCR is made therein, it would seem that correction of the VCR can be achieved by implanting ions of neutral species in the resistive region, preferably in the vicinity of the PN junction. These crystal defect generating ions have the property of improving the linearity of the I-V characteristic of the resistor. In this regard, more particular reference should be made to FIG. 7 of this patent. The main disadvantage of this method is that it requires an additional process step.

Still a further solution is proposed in French Patent 76 15001 filed on May 13, 1976 and assigned to the assignee of the present invention. In its more general aspect, this patent describes means for controlling the variations of the potential difference between the resistive region and the epitaxial layer in order to minimize such variations. For this purpose, the potential of the epitaxial layer is brought to a suitable value, preferably a value that varies as the average value of the resistor to be corrected. If $V_1$ and $V_2$ are the potentials respectively applied to the two terminals of the resistor, the potential to be applied to the epitaxial layer takes the form:

$$V_{epi} = \tfrac{1}{2}(V_1 + V_2) + V_0$$

where $V_0$ is a continuous biasing potential. When using this particular value of $V_{epi}$, the resistance becomes almost independent from the voltage applied to the terminals of resistor $V_R = V_1 - V_2$. However, a serious drawback of this process consists in the fact that, for achieving an efficient compensation, it is necessary to provide an auxiliary circuit which applies the suitable biasing value to each epitaxial layer. It is clear that such a solution, after integration, consumes surface area on the chip and reduces integration density. In addition, the required auxiliary circuits typically may be unable to provide the desired performance, particularly as pertains to speed.

SUMMARY OF THE INVENTION

It is, therefore, an object of the present invention to provide a resistor arrangement for integrated circuit structures which is linear over a range of voltages applied thereto.

It is a further object of the present invention to provide an arrangement for correcting the VCR of implanted resistors which allows the use of epitaxial layers exhibiting relatively low resistivities.

It is yet a further object of the present invention to provide an implanted resistor which is linear over a wide range of voltages applied to the terminals of the resistor.

It is yet a further object of the present invention to provide means for correcting the VCR of implanted resistors while requiring no additional process steps over conventional approaches to fabricating such resistors.

It is another object of the present invention to provide an arrangement for correcting the VCR of implanted resistors which does not require the association of auxiliary circuits which act to provide voltage for biasing the epitaxial layer of such resistors.

In accordance with the present invention, a method and apparatus is described for correcting the VCR of a resistor integral with a semiconductor body. The resistor typically comprises a resistive region of a first conductivity type formed via implantation or the like in an isolated layer of opposite conductivity type which isolated layer, in general, includes an epitaxial layer passivated by a dielectric layer. A metal layer is formed on said dielectric layer and covers, at least partially, said resistive region. The metal layer is brought to a suitable potential to produce equal and opposite variations in the resistance with respect to the ones created by said epitaxial layer, thereby acting to ensure its linearity.

The foregoing and other objects, features and advantages of the invention will be apparent from the following more particular description of a preferred embodiment of the invention, as illustrated in the accompanying drawings.

BRIEF DESCRIPTION OF THE DRAWINGS

FIG. 2A is a cross-sectional view of the implanted resistor of FIG. 1A with a metal electrode covering at least a portion of the resistive region while

DESCRIPTION OF THE PREFERRED EMBODIMENTS

Figure 1A:
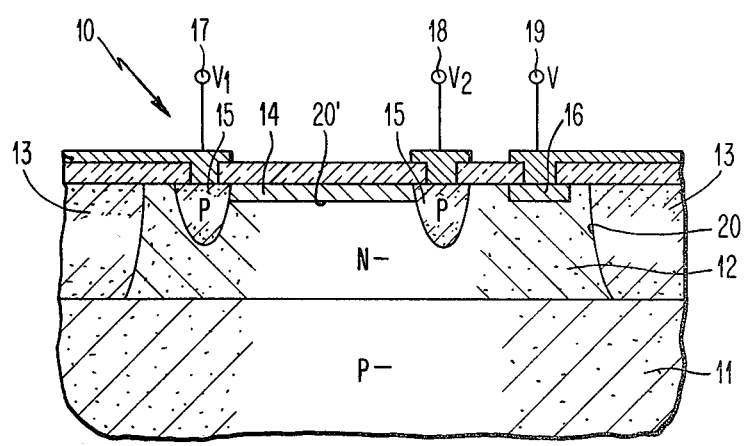
FIG. 1A is a cross-sectional view of a typical ion implanted resistor and FIG. 1B shows its equivalent circuit diagram.

Referring now more particularly to FIG. 1A, a conventional monolithic integrated resistor structure 10 is shown. An epitaxial layer 12, relatively thin (its thickness being of the order of a few microns) and lightly doped (average resistivity: 1 ohm-cm) is grown on a single-crystal semiconductor substrate 11 typically of silicon of a first type of conductivity, for example, P−. Although the present description deals with an epitaxial layer, it is obvious to those skilled in the art that the layer may as readily be formed by diffusion, ion implantation, etc. Within this layer of conductivity type opposite to that of the substrate, an isolated pocket is defined, typically by forming heavily doped isolation walls 13. These walls are of the first type conductivity and extend from the surface of the substrate.

An elongated region 14, intended to serve as a resistive region, is then formed by ion implantation of an impurity of the first type of conductivity. The latter step is generally carried out after two P type contact areas (shown at 15) have been formed concurrently with the diffusion of the base regions of the bipolar transistors. These contact areas, which are fairly heavily doped relative to the resistive region proper, assure that the value of the resistor defined by resistive region 14 will only be determined by the sheet resistance. A second region 16, heavily doped and of the second type of conductivity, is generally formed concurrently with the emitter regions of said bipolar transistors to serve as contact area for the epitaxial layer. Ohmic contacts to the resistor are formed as shown at 17 and 18. The second region 16 is also provided with an ohmic contact, as shown at 19. The techniques associated with the manufacturing of implanted resistors are well known in the art. Detailed description of manufacturing processes are readily available. In this regard, U.S. Pat. No. 3,902,926 is of particular significance. Further, reference may also be made to the article by J. Den Boer mentioned above.

As shown in FIG. 1A, potentials $V_1$ and $V_2$ are applied to ohmic contacts 17 and 18, respectively. Ohmic contact 19, which serves to make contact to epitaxial layer 12, may be left unconnected, thus providing a floating epitaxial layer. However, this mode is generally undesirable. Alternatively, layer 12 may be connected to a suitable potential source as shown in FIG. 1A, while the most negative potential of the circuit is applied to substrate 11 thereby acting to reverse bias PN junction 20 between isolation wall 13 and substrate on the one hand, and epitaxial layer 12, on the other hand. This reverse bias assures the electrical isolation of the pocket thus defined. If preferred, the most positive potential of the circuit may be connected to contact 19, thereby ensuring the electrical isolation of resistive region 14 relative to the epitaxial layer. The latter arrangement is required if several resistors are to be formed in the same epitaxial pocket. Thus, in all cases, ohmic contact 19 permits a desired potential to be applied to the epitaxial layer.

Figure 1B:
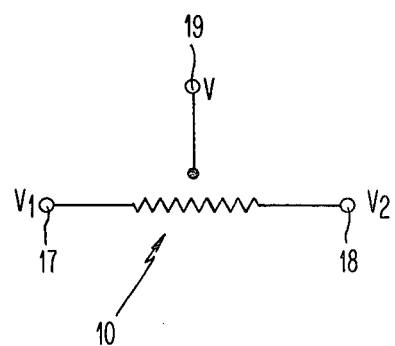

FIG. 1B also shows the electrical diagram for implanted resistor 10. Elements of this diagram which are like elements of the cross-sectional view in FIG. 1A are given the same reference numerals. The value R of resistor 10 can be expressed as follows when only the effect of the depletion layer on the VCR is taken into account:

$$R = R_o (1 + \lambda V_{eff}) \quad (1)$$

where
- $R_o$ is the intrinsic value of the resistor as determined from the nature and the size of the semiconductor material involved,
- $\lambda$ is the VCR, and
- $V_{eff}$ can be approximated using the empirical expression:

$$V_{eff} = V_{epi} - V_{RP} + k V_R \quad (2)$$

where
- $V_{epi}$ is the potential applied to the epitaxial layer,
- $V_{RP}$ is the value of the most positive potential across the resistor (in this example, it is assumed that $V_{RP} = V_1$),
- $V_R$ is the potential drop across the resistor, i.e. $V_R = V_1 - V_2$ ($V_1$ and $V_2$ being two essentially variable potentials), and
- k is a coefficient which is essentially dependent upon the sheet resistance of the resistive region; it has been demonstrated experimentally that the value of k varies between 0.4 and 0.6. An approximate value of 0.5 can be used. $V_{eff}$ and therefore the value R of the resistor are a function of essentially variable potentials $V_1$ and $V_2$.

By assuming that k=0.5, after combination with eq. (2), eq. (1) gives:

$$R = R_o [1 + \lambda(V_{epi} - V_{RP} + 0.5 V_R)] \quad (3)$$

An object of French Pat. No. 76 15001 is to make $V_{eff}$ equal to a constant, whereby the resistance will be independent of applied voltages $V_1$ and $V_2$. Such a result can be obtained by applying to the epitaxial layer containing the resistor whose VCR is to be corrected, a potential which obeys the general expression $$V_{epi} = \tfrac{1}{2} (V_1 + V_2) + V_o \quad (4)$$

where $V_o$ is the voltage required to reverse bias the PN junction 20' (as shown in FIG. 1A) formed between P type resistive region 14 and N type epitaxial layer 12, on the one hand, and junction 20, on the other hand, as previously described. Substituting $V_{epi}$, as defined in Eq. (4), and $V_{RP} = V_1$ into Eq. (3) gives:

$$R = R_o (1 + \lambda V_o)$$

This shows that this particular value of $V_{epi}$ makes $V_{eff}$ independent of $V_R$, the voltage applied across the resistor. Therefore, the resistance becomes independent of voltages $V_1$ and $V_2$.

Figure 3A:
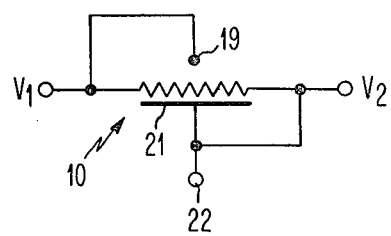
FIG. 3A shows the circuit diagram of a first embodiment of the invention in which the VCR of an implanted resistor is corrected in accordance with the principle of the present invention.
Figure 4:
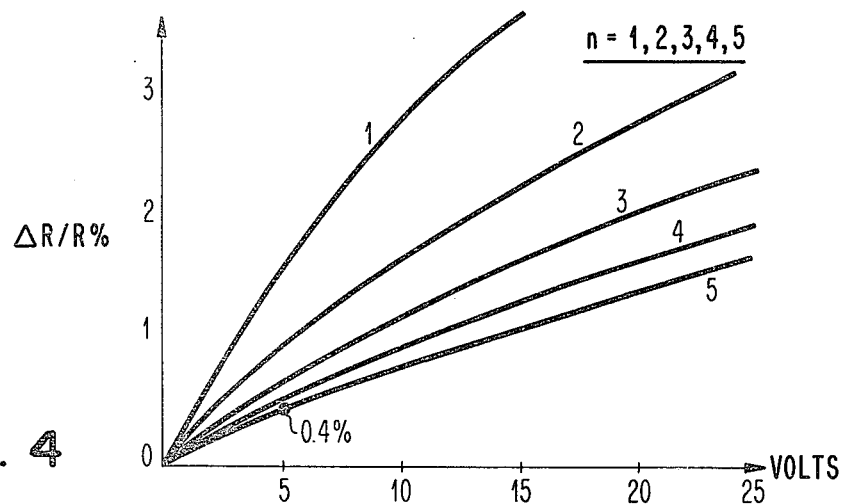
FIG. 4 shows the variations ($\Delta R$)/R (in percentage) of an implanted resistor (which can be divided into several parts) according to the voltage applied to the epitaxial layer, when there is no metal electrode to correct the VCR.

However, as shown in FIGS. 3A and 4 of above-cited French Pat. No. 76 15001, to obtain a biasing voltage equal to $\tfrac{1}{2} (V_1 + V_2)$, it is required to provide either an image circuit (FIG. 4) or additional circuits (FIG. 3A).

Figure 2A:
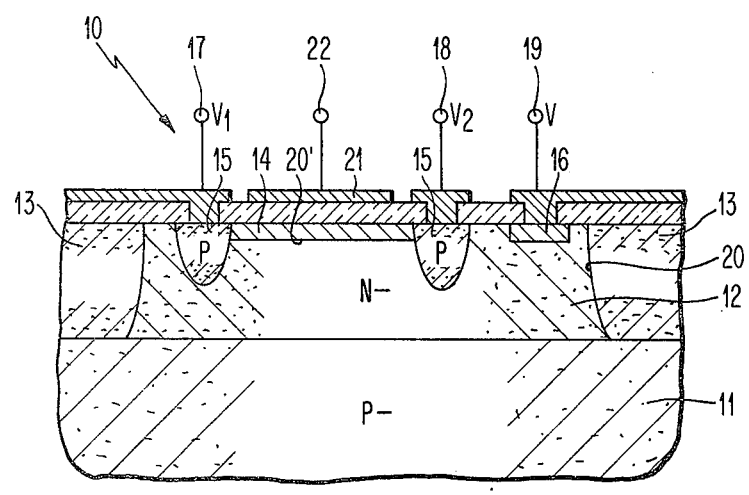
Figure 2C:
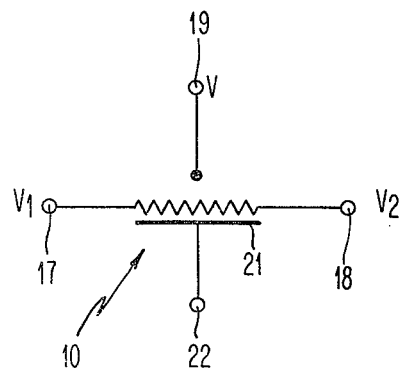
FIG. 2B is a top view of the same resistor and FIG. 2C shows its equivalent circuit diagram.
Figure 2B:
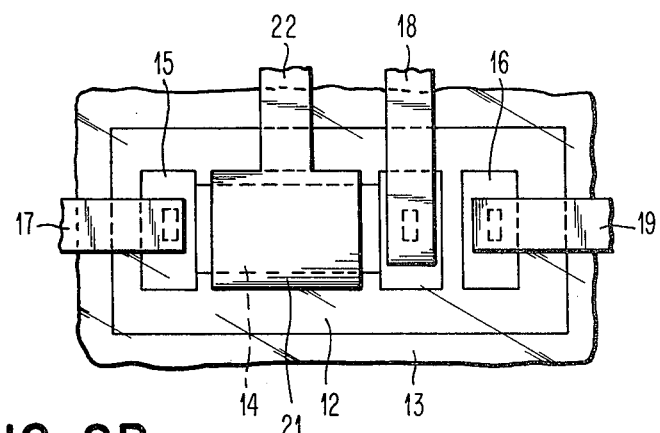
Figure 3B:
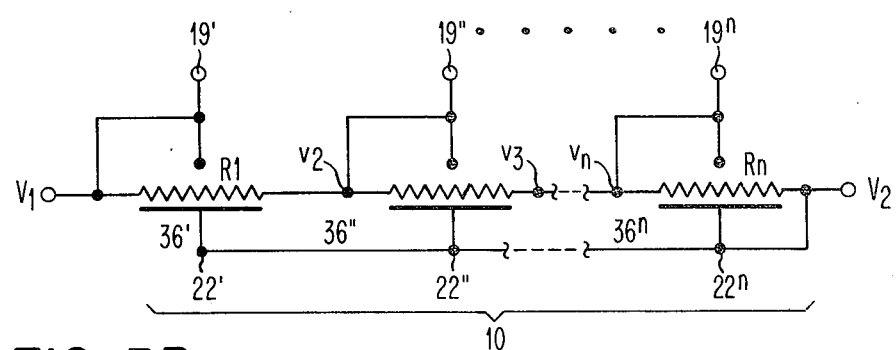
FIG. 3B shows the circuit diagram of an implanted resistor the VCR of which is reduced by operation in several segments or elements.

A simplified embodiment is shown in FIG. 3B of the cited French patent. As before, the object here is to reduce the variations in the potential difference between the resistive region and the epitaxial layer, but contrary to the solutions illustrated in FIGS. 2 and 3A, the variations of $V_{eff}$ are reduced but not cancelled. As shown in FIG. 3B of this patent, ohmic contact 19 is connected to the most positive of voltages $V_1$ and $V_2$ (it is assumed that $V_1 > V_2$). In other words, one applies the voltage $V_{epi} = V_1$ instead of a voltage of the form $$V_{epi} = \tfrac{1}{2} (V_1 + V_2) + V_o$$

Then, with $V_{RP} = V_1$ and k=0.5, Eq. (2) becomes:

$$V_{eff} = 0.5 V_R$$

and the value of the resistor is no longer a constant as in expression (1) but is now defined by:

$$R = R_o (1 + \lambda/2 V_R)$$

whereby R increases with the voltage applied across the resistor. In the latter case, the VCR correction achieved is only approximate. This solution leads therefore to an appreciable decrease of the VCR in the resistor. However, this solution is particularly interesting where the potential different $V_R$ across the resistor is low and the value of $$(V_1 + V_2)/2$$

is high. However, the simplicity of this solution renders it attractive but it can be used only when the single pole signals are such that $V_1 > V_2$.

In another simplified embodiment described in above-cited French Pat. No. 76 15001, resistor 10 of value R has been divided into two portions 36' and 36" of equal value, which are electrically isolated from each other. Resistor 36' has its ohmic contact 19' connected to $V_1$ and resistor 36" has its ohmic contact 19" connected to $$(V_1+V_2)/2$$

The above-cited French Pat. No. 76 15001 shows that the resulting value of the resistor can be written as follows:

$$R = R_o(1+\lambda/2+V_R/2)$$

It appears that by dividing the resistor in two equal portions, the value of the coefficient of $V_R$ which is $\lambda$ or practically the VCR, can be halved. More generally, if resistor R is divided into n equal portions, each one being located in electrically isolated pockets, then $$R = \sum_1^n R_i$$

and the VCR is divided by n.

All of these arrangements, as described in the cited French patent, are advantageously simple and do not require any additional steps but do, however, have the disadvantage of providing only an imperfect correction of the VCR.

In accordance with the principles of the present invention, it has been found that the linearity of an implanted resistor is also affected by the presence of a metal layer provided above the resistive region. With such an arrangement, it has been found that the VCR is not only a function of the difference of potential between the epitaxial layer and the resistive region but, most significantly, is also affected by the presence of a metal electrode provided above the resistor.

In accordance with the present invention, the resistor arrangement in FIG. 2A shows the same implanted resistor as the one shown on FIG. 1 but is also provided with a conducting electrode 21 conventionally made of metal and provided with a contact 22. FIG. 2B shows the resistor 10 arrangement of FIG. 2A viewed from above. The equivalent electrical diagram of this resistor is shown on FIG. 2C.

As shown above, the value of resistor 10 may be given according to Eq. (3) as $$R = R_o[1+\lambda(V_{epi}-V_{RP}+0.5\ V_R)] \text{ or }$$

$$R = R_o[1+\lambda(V_{eff})]$$

It may be empirically shown that the effect of the metal layer on the value of the resistor when the metal is connected to the most negative potential leads to the following equation:

$$R = R_o[1-\sigma(-V_{met}+V_{RN}+0.5\ V_R)] \quad (5)$$

where
- $\sigma$ is the VCR of the resistor due to the metal electrode,
- $V_{met}$ is the potential of the metal electrode, and
- $V_{RN}$ is the most negative potential applied to the resistor. It may be ground potential in a number of applications.

Therefore, one has in a similar way:

$$(V_{eff})_{met} = -V_{met}+V_{RN}+0.5\ V_R$$

When an implanted resistor is affected by both effects $\lambda$ and $\sigma$, this leads to the following equation:

$$R = R_o[1+\lambda(V_{epi}-V_{RP}+0.5\ V_R)]$$
$$[1-\sigma(-V_{met}+V_{RN}+0.5\ V_R)]$$

the development to the first order of which gives $$R = R_o[1+\lambda(V_{epi}-V_{RP}+0.5\ V_R)] - \quad (6)$$
$$\sigma(-V_{met}+V_{RN}+0.5\ V_R)$$

or
$$R = R_o[1+\lambda(V_{eff})_{epi}-\sigma(V_{eff})_{met}] \quad (7)$$

Therefore, in accordance with the principles of the present invention, the VCR's are balanced, the one due to the depletion layer being balanced by the one due to the metal electrode.

Therefore, the relation governing a complete correction of the VCR is as follows:

$$\lambda(V_{eff})_{epi} = \sigma(V_{eff})_{met}$$

First Embodiment

FIG. 3A shows implanted resistor 10 the metal electrode of which is connected to the most negative potential $V_2$ and the epitaxy contact of which is connected to the most positive potential $V_1$, i.e.:

$$V_{RP}=V_1,\ V_{RN}=V_2,\ V_{epi}=V_1,$$

$$V_{met}=V_2 \text{ and } V_R=V_1-V_2$$

substituting these values in eq. (6) gives:

$$R = R_o[1+0.5\ V_R(\lambda-\sigma)] \quad (8)$$

Therefore, there is always some compensation which can be perfect when $\sigma = \lambda$. In the latter case, the value of the resistor is equal to $R_o$ whatever the current flowing through it may be. However, $\sigma$ and $\lambda$ are always, in fact, different, $\lambda$ generally exceeding $\sigma$.

Second Embodiment

FIG. 3B shows an implanted resistor R which is divided into n resistors, R1 to Rn of identical values equal to R/n for simplifying the description.

As shown in eq. (6)

$$R_1 = \frac{R_o}{n}[1+\lambda(V_1-V_1+0.5\frac{V_R}{n}) - \sigma(-V_2+V_2+0.5\frac{V_R}{n})]$$

which becomes $$R_1 = \frac{R_o}{n}[1+0.5\lambda\frac{V_R}{n} - \sigma(-V_2+V_2+0.5\frac{V_R}{n})]$$

Also $$R_2 = \frac{R_o}{n}[1+0.5\lambda\frac{V_R}{n} - \sigma(-V_2+v_3+0.5\frac{V_R}{n})]$$

and $$Rn = \frac{Ro}{n}[1 + 0.5\lambda \cdot \frac{V_R}{n} - \sigma(-V_2 + V_2 + 0.5\frac{V_R}{n})]$$

By summing $$R = \sum_1^n R_i = \frac{Ro}{n}[n + 0.5\lambda\ V_R - \sigma((1-n)V_2) + (v_2 + \ldots v_n) + 0.5\ V_R]$$

which can be written as follows:

with $v_2 + \ldots + v_n = \sum_2^n v_i = (n-1)V_2 + \frac{(n-1)(n)}{2} \cdot \frac{V_R}{n}$ $$R = \frac{Ro}{n}[n + 0.5\lambda\ V_R - \sigma(\frac{n}{2})V_R]$$

$$R = Ro[1 + 0.5(\frac{\lambda}{n} - \sigma)V_R]$$

The compensation is ensured for $$\lambda/n = \sigma \qquad (9)$$

Thus, it is possible to choose n (the number of resistors) and σ (directly related to the amount of metal covering the resistive region) such as to ensure the required correction. As shown in FIGS. 2A and 2B, the metal cannot cover the whole resistive region due to the physical tolerances and design rules of the circuits. In a conventional application, a maximum of 80% of this surface could be covered (parameter L is variable). That is $$\sigma = (S_M/S_R)\ \sigma_i \leqq 0.8\ \sigma_i \qquad (10)$$

with $S_M$=the surface of the metal electrode above resistive region $S_R$ and $\sigma_i$=the intrinsic coefficient.

Therefore, the final eq. can be written as follows:

$$(\lambda/\sigma_i) = (S_M/S_R) \cdot n$$

It should be noted that 100% of the implanted portion can be covered if the diffused portions 15 (if any) are long enough. However, it is advantageous to aim at a percentage lower than the maximum to allow a final adjustment appropriate to the exact parameters of the process to be carried out, and thus, to gain additional flexibility in the correction of the VCR.

Example: If $\lambda$=4000 ppm and $\sigma_i$=2000 ppm, with $(S_M/S_R)$=0.5, which are current values, one has n=4.

Typically, the metal electrode may be provided when carrying out the photolithography step which forms the first metallurgy level. In accordance with the resistor arrangement of the present invention, then, fabrication thereof only requires a modification to the mask without requiring additional steps in the fabrication process. However, consideration will be given to the division of the resistor into an appropriate number of individual epitaxy pockets. The effect of factors n and $\eta=(S_M/S_R)$ on the correction of the VCR will be described in the following with reference to FIGS. 4, 5 and 6.

FIG. 4 shows (curve 1) the rate of variation $(\Delta R)/R$ (in percentage) of the value of an implanted resistor having its first terminal connected to ground and its second terminal connected to a positive voltage which is also applied to the epitaxy layer in the absence of correcting electrode 21. The same rate of variations is also shown for a resistor divided in several equal portions (curves 2 to 5). In a particular application where V=5 V and the resistor is divided in 5 portions, then $(\Delta R)/R$=0.4% (for a single resistor $(\Delta R)/R$=1.7%).

Figure 5:
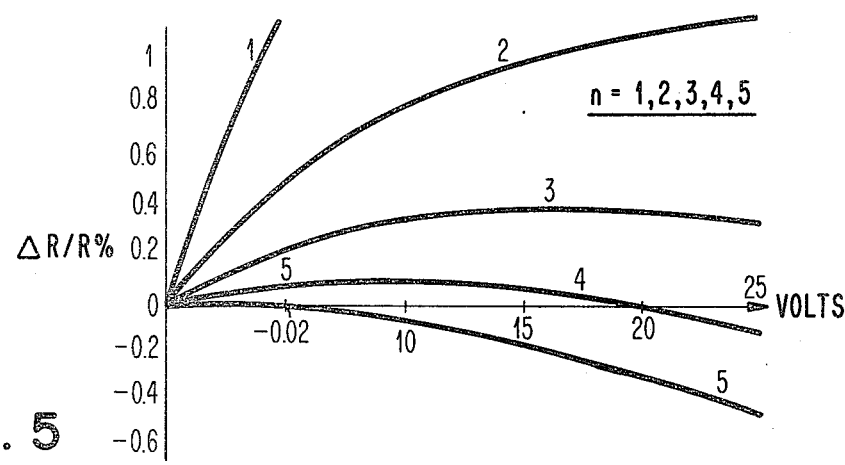
FIG. 5 shows the variations ($\Delta R$)/R (in percentage) of a resistor which can be divided into several parts according to the voltage applied to the epitaxial layer, in presence of a correcting metal electrode.

FIG. 5 shows the rate of variation $(\Delta R)/R$ (in percentage) of the various cases of implanted resistors shown in FIG. 4 but in which the VCR has been corrected by the presence, over the resistive regions, of metal electrodes brought to the most negative potential (in this case, the ground potential).

With the arrangement of FIG. 5, when $V_{epi}$=5 V and n=5, then $(\Delta R)/R$=−0.02%. That is to say, if potential V applied to the resistor varies from 0 to 5 V, the maximum variation of the resistor will be 0.2%×R. The negative sign indicates that there is an over compensation. As can be seen, this is twenty times smaller than for the same case of FIG. 4.

Figure 6:
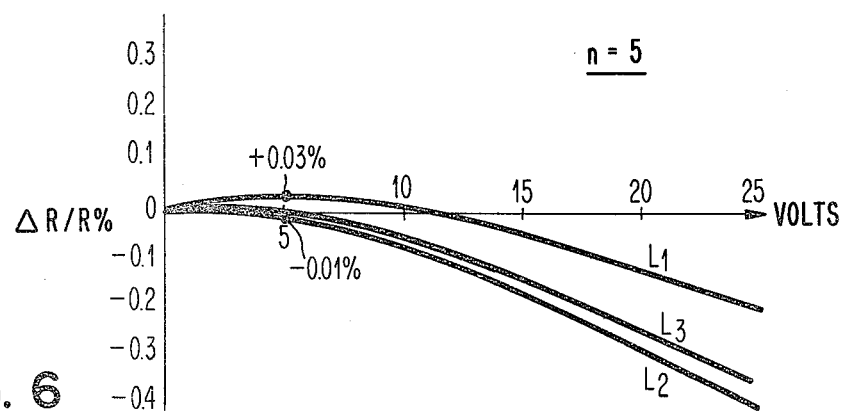
FIG. 6 shows the variations ($\Delta R$)/R (in percentage) of a resistor divided into five parts according to the amount of metal covering the resistive region.

Finally, in order to show the effect of factor η, reference is made to FIG. 6 which represents, in the case of a resistor R divided in 5 equal portions, the rates of variation $(\Delta R)/R$ (in percentage) in accordance with the covering of the resistive region by the metal electrode. In a particular case, each elementary resistive region of type P is a rectangle of 0.0625 mm length and 0.030 mm width. By applying the above described 80% rule, the maximum length of the metal electrode should be approximately 0.050 mm. With n=5, the results are shown for two lengths of the metal electrode, $L_1$=0.045 mm and $L_2$=0.050 mm. It appears that for n=5, V=5 V and $L_3$=0.049 mm, the rate of variation $(\Delta R)/R$ obtained is practically nil. With such an arrangement, it can be said that the VCR of the resistor is perfectly corrected.

It should be noted that the structure of implanted resistors provided with a metal electrode for correcting the VCR is different, despite apparent similarities, from an insulated gate field effect resistor, such as the one described in French Pat. No. 1 566 559 assigned to Thomson-CSF. However, it should be understood that in accordance with the principles of the present invention, the value of the resistor is determined by the resistivity of the resistive region, the only function of the metal electrode covering it being for the correction of the VCR. In contradistinction, in the structure shown in French Pat. No. 1 566 559, the metal electrode is brought to a potential such that it modifies the resistivity of the substrate surface zone to adjust the resistor to a desired value.

While the invention has been particularly shown and described with reference to a preferred embodiment thereof, it will be understood by those skilled in the art that numerous changes in form and detail may be made therein without departing from the spirit and scope of the invention.

Having thus described my invention, what I claim as new, and desire to secure by Letters Patent is:

1. A method of correcting the voltage coefficient of resistance of a resistor arrangement integral with a semiconductor body and arranged to include at least a resistive region of first conductivity type formed in an isolated portion of an epitaxial layer of opposite conductivity type with said resistive region passivated by a dielectric layer, the improvement comprising:

a resistive region including N discrete resistive segments formed in isolated portions of said epitaxial layer and electrically coupled to one another;

N discrete segments of conductive material formed on said dielectric layer over at least a portion of respective ones of said discrete resistive segments; and means to couple all said discrete segments of conductive material to a voltage point on said N discrete resistive segments to provide voltage potential to said discrete segments of conductive material to vary the resistance value of said N discrete resistive segments an amount equal to and opposite the amount of variation in resistance value caused by potential applied to said epitaxial layer of opposite conductivity type.

2. The method as set forth in claim 1 wherein said isolated portions of said epitaxial layer are electrically connected to respective ones of said discrete resistive segments at a point thereon which is of a potential opposite in polarity to the potential applied to said discrete segments.

3. The method according to claim 2 characterized in that said resistive region is formed by ion implantation.

4. In a resistance arrangement integral with a semiconductor body including resistor means of first conductivity type semiconductor formed in a layer of opposite conductivity type semiconductor with said resistor means passivated by a dielectric layer and having terminal means to apply a potential thereacross, the improvement residing in said resistor means including N discrete resistive regions formed in isolated portions of said layer of opposite conductivity type semiconductor and electrically coupled to one another with each of said N discrete resistive regions having a respective one of N discrete segments of conductive material formed on said dielectric layer over at least a portion thereof, and first means to couple each of said N discrete segments of conductive material to the said terminal means at the one end of said resistor means which provides a potential to said N discrete segments of conductive material to vary the resistance value of said resistive regions an amount equal to and opposite the amount of variation in resistance value caused by potential applied to said layer of opposite conductivity type semiconductor and second means to couple said layer of opposite conductivity type semiconductor to the end of said N discrete resistive regions opposite to the said one end.

5. The resistance arrangement of claim 4 wherein said resistor means is made of a P-type material.

6. The resistance arrangement of claim 5 wherein said first means to couple said N discrete segments of conductive material to the said terminal means at one end of said resistor means is coupled to that end of said resistor means which is at a negative potential with respect to the opposite end.

7. The resistance arrangement of claim 4 wherein said resistor means is made of an N-type material and wherein said N discrete segments of conductive material are coupled to the said terminal means at the end of said resistor means which is at a positive potential with respect to the opposite end.

* * * * *